United States Patent
Hayashi et al.

(10) Patent No.: US 8,223,548 B2
(45) Date of Patent: Jul. 17, 2012

(54) MEMORY DEVICE WITH REDUCED PROGRAMMING VOLTAGE METHOD OF REDUCTION OF PROGRAMMING VOLTAGE AND METHOD OF READING SUCH MEMORY DEVICE

(75) Inventors: Yutaka Hayashi, Tsukuba (JP); Kazuhiko Matsumoto, Uji (JP); Takafumi Kamimura, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 252 days.

(21) Appl. No.: 12/601,788

(22) PCT Filed: May 23, 2008

(86) PCT No.: PCT/JP2008/059592
§ 371 (c)(1),
(2), (4) Date: Nov. 24, 2009

(87) PCT Pub. No.: WO2008/146760
PCT Pub. Date: Dec. 4, 2008

(65) Prior Publication Data
US 2010/0208522 A1    Aug. 19, 2010

(30) Foreign Application Priority Data

May 24, 2007  (JP) .................................. 2007-138470

(51) Int. Cl.
*G11C 16/04* (2006.01)
(52) U.S. Cl. .................. 365/185.18; 365/171; 365/173; 365/185.28

(58) Field of Classification Search ............. 365/185.18, 365/171, 173, 185.28
See application file for complete search history.

(56) References Cited

U.S. PATENT DOCUMENTS

| | | | |
|---|---|---|---|
| 6,381,171 B1 * | 4/2002 | Inomata et al. | ............... 365/173 |
| 6,472,705 B1 | 10/2002 | Bethune et al. | |
| 6,475,857 B1 * | 11/2002 | Kim et al. | ..................... 438/240 |
| 6,686,240 B2 * | 2/2004 | Yi et al. | ......................... 438/253 |
| 2004/0095837 A1 | 5/2004 | Choi et al. | |
| 2006/0255399 A1 | 11/2006 | Kim et al. | |

FOREIGN PATENT DOCUMENTS

JP    S58-23483 A    2/1983
(Continued)

OTHER PUBLICATIONS

IPCT/IPEA/409 in PCT/JP2008/059592, May 23, 2008.
(Continued)

*Primary Examiner* — Connie Yoha
(74) *Attorney, Agent, or Firm* — Chen Yoshimura LLP

(57) ABSTRACT

A memory device (1) includes at least a first semiconductor region (100) having a length, a first surface, and a cross section surrounded by the first surface, a memory means (300) provided on the first surface, and a gate (400) provided on the memory means (300), and an equivalent sectional radius of the cross section of the first semiconductor region (100) is set to be equal to or smaller than an equivalent silicon oxide film thickness of the memory means (300) to realize low program voltage. The equivalent sectional radius r of the cross section is set to be 10 nm or less and the gate length is set to be 20 nm or less so that multi-level interval converted to gate voltage becomes a specific value which can be identified under the room temperature.

35 Claims, 9 Drawing Sheets

FOREIGN PATENT DOCUMENTS

| | | |
|---|---|---|
| JP | 10-093083 A | 4/1998 |
| JP | 2000-156423 A | 6/2000 |
| JP | 2000207881 A | 7/2000 |
| JP | 2004-172616 A | 6/2004 |
| JP | 2006-229233 A | 8/2006 |
| WO | 2006/132158 A1 | 12/2006 |

OTHER PUBLICATIONS

International Search Report (ISR) for PCT/JP2008/059592 for Examiner consideration, citing U.S. Patent No. 1, U.S. Patent Application Nos. 1-2, and Foreign Patent Document Nos. 1-6 listed above, May 23, 2008.

Written Opinion (PCT/ISA/237) of PCT/JP2008/059592 as concise explanation of relevance, May 23, 2008.

Shin et al., "A Novel NAND-type MONOS Memory using 63nm Process Technology for Multi-Gigabit Flash EEPROMs", session 13-6, 2005 IEDM Technical Digest, pp. 337-340, Dec. 2005.

English-Translation of Internatinoal Preliminary Report on Patentability Chapter II of PCT/JP2008/059592, May 23, 2008.

Ohori et al., "Quantized characteristics in carbon nanotube-based single-hole memory with a floating nanodot gate", Appl. Phys. Lett. 98, May 31, 2011, 223101-1-223101-3.

"Thermal Oxidation" Wikipedia retrieved from the internet: URL:http://en.wikipedia.org/wiki/Thermal_oxidation Cited in the extended European search report, Jun. 6, 2010.

The extended European search report dated Aug. 31, 2010, in a counterpart European patent application No. 08 764638.6 for Examiner consideration.

* cited by examiner

MEMORY DEVICE WITH REDUCED PROGRAMMING VOLTAGE METHOD OF REDUCTION OF PROGRAMMING VOLTAGE AND METHOD OF READING SUCH MEMORY DEVICE

TECHNICAL FIELD

The present invention relates to a memory device and a reading method thereof. More specifically, the present invention relates to a memory device using a semiconductor or the like and a reading method thereof.

BACKGROUND ART

When processing dimension of a MOSLSI is reduced and gate length is shortened, an operating voltage of MOS transistor becomes smaller accordingly. Power source voltage of a MOSLSI of 65 nm processing generation which is expected to be mass-produced within a year or two years is reduced to approximately 1V. Moreover, a operation speed of an LSI has been attained more higher speed in every generation. However, in a floating gate type or multi-layered insulation films type semiconductor nonvolatile memory, it is difficult to reduce the writing voltage or erasing voltage thereof and it is also difficult to improve writing speed only by reduction of the gate length.

This is because in the case of a semiconductor nonvolatile memory having a floating gate, it is difficult to reduce a thickness of an insulation film provided between the floating gate and a channel surface with guaranteeing retention of memory. In the case of the multi-layered insulation films type semiconductor nonvolatile memory, a thickness of a tunnel insulation film between a memory site for charge storage and a channel surface cannot be reduced.

Therefore, the writing voltage in a NAND type flash memory is still approximately 17V and this is significantly high when compared to approximately 1V of power supply voltage of the MOS logic (refer to FIGS. 8 and 9 of Non-Patent-Document 1).

For the improvement of effective memory density of the nonvolatile memory, a technology to store in one memory cell multiple values which are more than two values of "1" and "0", so-called a multi-level memory, has been developed. However, because in this memory, a value of electric parameters such as floating gate potential, charge stored in the multiple insulation layer and gate threshold voltage, that continuously changes according to writing time and writing voltage, is splitted into multi-level by some control, it is difficult to clearly write between multi-level and to keep the each level separated without setting a large interval between each level.
Patent Document 1; Japanese Patent Laid Open Application, JP S58-23483 A;
Non-Patent-Document 1; Y. Shin et al., "A Novel NAND-type MONOS Memory using 63 nm Process Technology for Multi-Gigabit Flash EEPROMs", session 13-6, 2005 IEDM Technical Digest, pp. 337-340, December, 2005

DISCLOSURE OF THE INVENTION

Problem to be Solved by the Invention

In a conventional nonvolatile memory, since it is difficult to reduce voltage for writing or erasing, or to improve writing speed only by reduction of gate length, there is a problem that the writing voltage is very high.

Moreover, in the control of the multi-level memory for improvement of memory density of a conventional nonvolatile memory, there is a problem that it is difficult to clearly write a plurality of levels and keep the levels separated unless a large interval is set between the multi-levels.

In consideration of the above problems, a first purpose of the present invention is to provide a memory device which can reduce the voltage for writing or erasing (hereinafter they will be collectively called program voltage) of a nonvolatile memory without changing an absolute value of thickness of an insulation film, a memory device which can maintain memory retention characteristics well even if the absolute value of thickness of the insulation film is reduced, and a memory device in which multi-level storage can be carried out with a stable multi-level interval.

A second purpose of the present invention is to provide a reading method of information stored in the memory device.

Means for Solving Problem

To achieve the first purpose, a memory device of the present invention includes at least a first semiconductor region having a length, a first surface, and a cross-section surrounded by the first surface; a memory means provided on the first surface; and a gate provided on the memory means, wherein an equivalent sectional radius of the cross section of the first semiconductor region is equal to or smaller than an equivalent silicon oxide film thickness of the memory means.

Here, the equivalent sectional radius r is a radius of curvature of a circle having the same cross-sectional area in a case where the cross section is not a circle but is polygonal, as shown in a figure of a cross section in later-described FIG. 2. However, in a case where the cross-sectional area is polygonal, it is preferable that size of one side of the polygonal shape is equal to or smaller than an equivalent film thickness of the memory means converted to $SiO_2$ film thickness (hereinafter referred to as an equivalent oxide film thickness) tm.

Here, the equivalent oxide film thickness is a value of film thickness of the memory means multiplied by dielectric constant of silicon oxide and divided by dielectric constant of the memory means. In a case where the memory means is a multilayer film, the equivalent oxide film thickness is a sum of values of thickness of each layer multiplied by dielectric constant of silicon oxide and divided by dielectric constant of each layer respectively.

According to the above-mentioned configuration, the equivalent sectional radius r is set to be equal to or smaller than the equivalent oxide film thickness tm of the memory means and therefore it becomes possible to realize a memory device which can reduce the voltage for writing and erasing to approximately 70% or less of the program voltage of a conventional planar type device. If the equivalent sectional radius becomes smaller, reduction ratio of the voltage for writing and erasing becomes larger. Here, the planar device means a device which has a plane semiconductor surface longer than the equivalent oxide film thickness of the memory means under the memory means.

In the above-mentioned configuration, it is preferable that a first region and a second region are provided in contact with the first semiconductor region on both side of a gate and spaced apart across the gate.

According to the above-mentioned configuration, even if the equivalent oxide film thickness tm of the memory means is left unchanged, if the equivalent sectional radius r is reduced in a case where the gate length is reduced, substantial film thickness is reduced and it becomes unnecessary to reduce the equivalent oxide film thickness tm of the actual memory means according to a conventional MOS design theory.

Regulating the equivalent sectional radius r or the gate length Lg enables to carry out multi-level storage with a multi-level interval converted to a gate voltage difference, which is preferably a value equal to or more than kT/q (here, k is Boltzmann's constant, T is an absolute temperature of usage environment of the memory device, and q is elementary charge of an electron).

According to the above-mentioned configuration, multi-level converted to a gate voltage, which is unique to a device structure determined by the memory structure, can be realized irrespective of writing condition. The multi-level interval converted to a gate voltage difference can be set to a unique value which is equal to or more than kT/q which can be recognized against noise in the operation temperature.

It is preferable that the equivalent sectional radius is 10 nm or less and the gate length is 20 nm or less to realize the value of the multi-level interval converted to a gate voltage difference to be 0.026V or more.

It is preferable that length of a part of a line of intersection between the cross section of the first semiconductor region and the first surface, which is not covered by the gate, is equal to or less than the thickness of the memory means.

It is preferable that the equivalent oxide film thickness of the memory means is 20 nm or less.

The memory means may be either a multilayered insulation films or an insulation film including a layer of charge trapping atoms. The charge trapping atoms are in an aggregate form of some, between 1 and 10, atoms wherein the atoms are separated from each other. The memory means may be configured with a ferroelectric material.

It is preferable that the first semiconductor region includes silicon and a layer in the memory means which comes into contact with the first semiconductor region on the first surface is a thermally oxidized film having film thickness with small surface indices dependence.

It is preferable that the first semiconductor region includes a carbon nanotube or a compound semiconductor and a layer in the memory means which is in contact with the first semiconductor region on the first surface is silicon nitride.

Here, in a semiconductor having a hollow cross-sectional shape such as the carbon nanotube, there are an external surface and an inside surface. On an assumption that the external surface is the first surface and the inside surface is a second surface, a cross section which is surrounded by the first surface and includes the hollow part is collectively called a "cross section" in the present invention.

It is preferable that the multilayered insulation film includes an upper insulation film, a carrier trapping insulation film, and a lower insulation film along the direction to the surface of the first semiconductor region from the gate side.

It is preferable that the layer of charge trapping atoms includes an insulation film in which titanium or silicon atoms are buried. The titanium or silicon atoms are in an aggregate form of 1 or 10 or less atoms separated from each other. That is, it is preferable that the titanium or silicon atoms are buried with an average density of a mono-atomic layer.

It is preferable that the upper insulation film is a silicon oxide film or an aluminum oxide film.

It is preferable that the carrier trapping insulation film is a silicon nitride film. In a case where in the film or in an interface with another film a carrier trapping level exists like the silicon nitride film, a layer of charge trapping atoms is not always necessary.

It is preferable that the lower insulation film is a silicon oxide film or multilayered films of silicon oxide film and silicon nitride film.

A two-layer structured film including the upper and lower insulation films may be used as a simple multilayered insulation film. In this case, trapping and storage of a carrier, that is, memorization, is carried out in the vicinity of an interface of the two insulation films. For example, in a case where the lower insulation film is a silicon nitride film, a silicon oxide film or an aluminum oxide film may be used as the upper insulation film on the lower insulation film. Carrier trapping and memorization are carried out by a carrier trapping level formed in the silicon nitride film in the vicinity of the interface.

A reading method of a memory device in a case where the multi-level memory according to the present invention is realized is to apply a ramp voltage pulse to the gate and to count the number of current pulse obtained between the first and the second regions. Thus, the number of carriers trapped by the memory means can be detected.

According to the reading method of the memory device, it becomes possible to read multi-level information stored in the memory means of the memory device.

Effect of the Invention

According to the memory device of the present invention, for example, the equivalent sectional radius r is set to be equal to or smaller than the equivalent oxide film thickness tm of the memory means to reduce the voltage for writing and erasing to approximately 70% or less of a conventional planar device. If the equivalent sectional radius becomes smaller, reduction ratio of the voltage for writing and erasing becomes larger and memory retention characteristics are also improved.

Here, the planar device means a device which has a plane semiconductor surface longer than the equivalent oxide film thickness of the memory means under the memory means.

According to the memory device of the present invention, even if the equivalent oxide film thickness tm of the memory means is left unchanged, if the equivalent sectional radius r is reduced in a case where the gate length is reduced, effective film thickness is reduced and it becomes unnecessary to reduce the equivalent oxide film thickness tm of the actual memory means according to a conventional MOS device design theory.

According to the memory device and the reading method thereof of the present invention, multi-level converted to gate voltage, which is unique to a device structure determined by the memory structure, can be realized irrespective of writing condition. The multi-level interval converted to gate voltage difference can be set to a unique value which is equal to or more than the value kT/q which can be recognized against noise in the operation temperature. Here, k is Boltzmann's constant, T is an absolute temperature, and q is an elementary charge of an electron.

Figure 1:
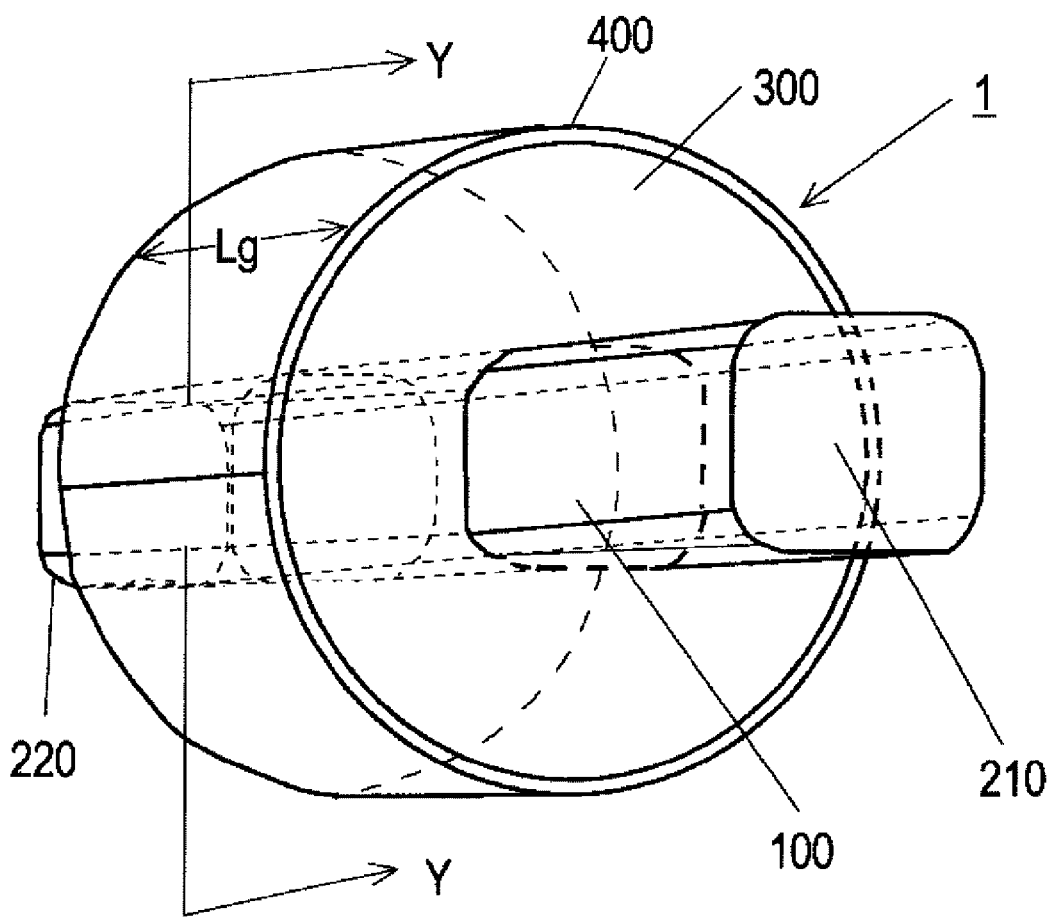
FIG. 1 is a perspective view schematically showing a configuration of a first embodiment of a memory device according to the present invention.

DESCRIPTION OF THE REFERENCE NUMERALS 1, 2, 3, 4, 5: memory device
10: substrate
12, 20: insulation film provided on the substrate
30: gap
100: first semiconductor region having a fine cross section
100A: first surface
101,102: catalyst layer
210: first region
211: part of the first region
212: part of the first region
213: part of the first region and electrode
220: second region
221: part of the second region
222: part of the second region
223: part of the second region and electrode
300: memory means
310: lower insulation film
311: layer of the lower insulation film to be in contact with the first semiconductor region
312: part of the lower insulation film
313: film formed simultaneously with a layer of the lower insulation film 311 to be in contact with the first semiconductor region
314: film formed simultaneously with a film that is the part of the lower insulation film 312
320: carrier trapping insulation film
320A: carrier trapping layer including atoms
323: film formed simultaneously with the carrier trapping insulation film 320
330: upper insulation film
333: film formed simultaneously with the upper insulation film 330
400: gate
500: surface passivation film

BEST MODE FOR CARRYING OUT THE CLAIMED INVENTION

Hereinafter, embodiments of the present invention will be explained in detail with reference to figures. In each of the figures, same reference numerals are given to the same or corresponding members and the present invention is described on specific embodiments by dividing it into each of the components.

Figure 2:
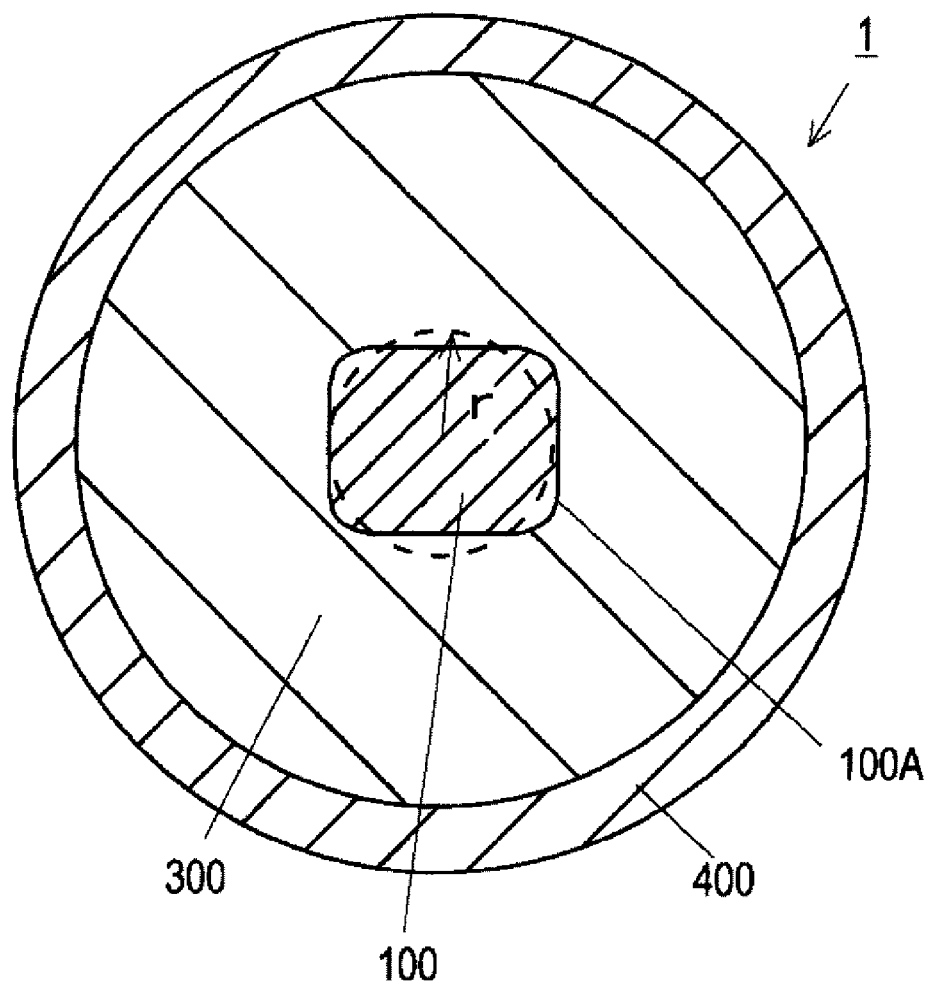
FIG. 2 is a cross-sectional view taken along Y-Y line of FIG. 1.

FIG. 1 is a perspective view schematically showing a configuration example of a memory device of the present invention and FIG. 2 is a cross-sectional view taken along Y-Y line of FIG. 1.

A memory device 1 of the present invention includes a first semiconductor region 100 having a fine cross section, a memory means 300 formed on the first semiconductor region 100, and a gate 400 provided on an outer periphery of the memory means 300. A first region 210 and a second region 220 which are adjacent to both edges of the first semiconductor region 100 may be provided while sandwiching the gate 400. A current flowing in the first semiconductor region 100 can be taken from the first region 210 and the second region 220. Here, Lg in FIG. 1 indicates a gate length.

As shown in FIG. 2, the first semiconductor region 100 has a first surface 100A and a cross section surrounded by the first surface 100A. The first semiconductor region 100 has the first surface 100A which is in contact with the memory means 300 and a predetermined dimension in a direction perpendicular to the paper (hereinafter referred to as a first length). A direction parallel to the first semiconductor region 100 on the paper is the fine cross section surrounded by the first surface 100A. That is, the first semiconductor region 100 includes the first surface 100A, the first length, and the cross section surrounded by the first surface 100A.

The memory means 300 is provided on the first surface 100A of the first semiconductor region 100. The figure shows a case where the circumference of the first semiconductor region 100 having the fine cross section is completely surrounded by the gate 400.

Here, the circumference of the first semiconductor region 100 having the fine cross section may not be completely surrounded by the gate 400 and the gate 400 may have be provided with an aperture having a size of film thickness of the memory means 300 or so. That is, a part of a length of intersection between the cross section of the first semiconductor region 100 and the first surface 100A, which is not covered with the gate 400, may have a size which is equal to or less than the thickness of the memory means 300.

As shown in FIG. 2, the fine cross section of the first semiconductor region 100 has an equivalent sectional radius (r). The equivalent sectional radius r is a radius of curvature of a circle having the same cross-sectional area, irrespective of either the cross section is circle or polygonal, as shown in the figure. However, if the cross section is polygonal, one side thereof is preferably equal to or less than an equivalent thickness of a material of the memory means 300 converted to an $SiO_2$ film thickness (hereinafter referred to as equivalent oxide film thickness) tm.

Here, the equivalent oxide film thickness is a value of film thickness of the memory means 300 multiplied by dielectric constant of silicon oxide and divided by dielectric constant of the memory means 300. In a case where the memory means 300 is multilayer films, the equivalent oxide film thickness is a sum of values of thickness of each layer multiplied by dielectric constant of silicon oxide and divided by dielectric constant of each layer respectively.

The first semiconductor region 100 having the fine cross section may include Si, Ge, GaAs, GaN, a carbon nanotube (CNT) or the like.

Here in a case where the semiconductor has a hollow cross-sectional shape such as the carbon nanotube, there are an external surface and inside surface. If it is assumed that the external surface is the first surface 100A and the inside surface is a second surface 100B, the cross section which is surrounded by the first surface and including the hollow part will be collectively referred to as a "cross section" in the present invention.

Figure 3:
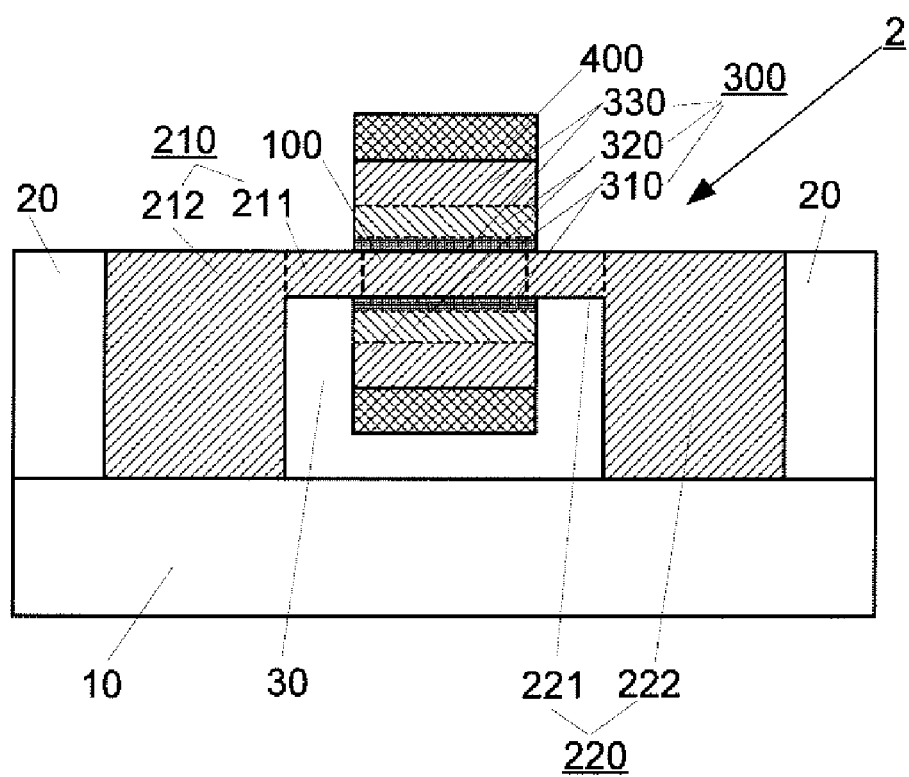
FIG. 3 is a cross-sectional view schematically showing a configuration of a second embodiment of a memory device of the present invention.

For example, the memory means 300 is provided with multilayered insulation films. It is preferable to use multilayered insulation films A as shown in FIG. 3 described later and multilayered films B. The multilayered insulation films A are comprising: a lower insulation film 310; a carrier trapping insulation film 320; and an upper insulation film 330. The multilayered insulation films B are comprising: the lower insulation film 310; the layer of carrier trapping atoms 320A (not shown in the figure); and the upper insulation film 330. The multilayered films B have the layer of carrier trapping atoms 320A (not shown in the figure) instead of the carrier trapping insulation film 320 in the multilayered films A. Hereinafter, configuration of the multilayer film will be expressed from upper to lower side with "/" between each film. For example, the multilayered insulation films A is expressed as: the upper insulation film 330/the carrier trapping insulation film 320/the lower insulation film 310. A specific example of a configuration of the multilayered films A includes a MONOS structure having a silicon oxide film (the upper insulation film 330)/a silicon nitride film (the carrier trapping insulation film 320)/silicon oxide film (the lower insulation film 310). The MONOS structure has already been used in the practical applications (refer to the Patent Document 1).

Here, the lower insulation film 310 is an insulation film provided on a surface side of the first semiconductor region 100 and the upper insulation film 330 is an insulation film provided on the gate 400 side.

It is preferable that other examples of the multilayered insulation films include:
A multilayered insulation films having (a high dielectric constant insulation film of any of alumina, hafnium oxide, hafnium silicon oxide, or the like)/a high dielectric constant insulation film or a silicon nitride film/silicon oxide film;
A multilayered insulation films having (alumina or silicon oxide film)/the layer of carrier trapping atoms/the silicon oxide film; and
A multilayered insulation films having (alumina or silicon oxide film)/(silicon nitride film or the layer of carrier trapping atoms)/silicon oxide film/silicon nitride film.

Here, the films in the parentheses in the above-mentioned examples are films which are not necessarily used. It is possible to retain memory with two-layered films having silicon oxide film/silicon nitride film, or alumina/silicon nitride film as multilayered insulation films having smallest number of layers. Here, alumina includes aluminum oxide such as $Al_2O_3$.

When the memory means 300 has the multilayered films A, there are two regions where a charge of an electron or a hole is trapped. One is a carrier trapping site inside the carrier trapping insulation film 320. The other is a carrier trapping site formed in an interface either between the carrier trapping insulation film 320 and the upper insulation film 330, or between the carrier trapping insulation film 320 and the lower insulation film 310.

When the memory means 300 has the multilayered films B including the layer of carrier trapping atoms, the layer of carrier trapping atoms 320A (not shown in the figure) is doped by an atoms which trap a carrier of an electron or a hole (hereinafter referred to as a carrier trapping atom) at a interface between the upper insulation layer 330 and the lower insulation film 310 or in the vicinity of the interface either of them mentioned above. Specifically, the layer of carrier trapping atoms 320A (not shown in the figure) is an insulation layer where carrier trapping atoms such as atoms having small thermal diffusion constant in a silicon oxide film such as titanium (Ti), or constituent atoms of a silicon oxide film or a nitride film, that is, Si or the like are dispersedly buried. The carrier trapping atoms are aggregate of 1 to 10 or less atoms which is buried in the vicinity of an interface of the upper and lower insulation films. The aggregate of atoms has a different dimension level from that of a conventional nanocrystal or a nanodot having 10 nm-level radius. An average surface density of atoms, when above-mentioned aggregates are spread on a planar surface, is approximately one atomic layer level.

When the first semiconductor region 100 includes a carbon nanotube or a compound semiconductor where an electric defect or an atomic defect is caused if oxygen reacts on the surface thereof, the lower insulation film 310 in contact with the surface of the first semiconductor region 100 is preferable to be a two-layered films consisting of the silicon nitride film 311 and the silicon oxide film 312. If the silicon nitride film 311 in contact with the surface of the first semiconductor 100 has a thickness of 1 to 4 nm and the silicon oxide film 312 has a thickness of 2 to 3 nm, it becomes possible to allow conduction by tunneling of a electron or a hole under the high electric field during writing and erasing and to prevent a movement of an written electron or a hole under the memory retention state.

The memory means 300 may be configured with a ferroelectric film. When a ferroelectric material such as PZT is formed directly on the surface of the first semiconductor region 100, a surface mobility of carriers are largely deteriorated in many semiconductors due to the defects in atomic bindings. This can be prevented if a ferroelectric material is provided on the surface of the first semiconductor region 100 via a silicon nitride film or the like having a thickness of several nm. When the first semiconductor region 100 is made of a carbon nanotube, a ferroelectric film is directly formed on the surface of nanotube. This is because that a dangling bond of the carbon nanotube 100 itself does not appear on the surface thereof. Then, the surface of the carbon nanotube can be electrically controlled from the gate 400 which is disposed on the surface of the ferroelectric film on the surface of the carbon nanotube. In this case, when the ferroelectric film is consisting of a non-oxide material or an organic material, there is no problem. If an oxide ferroelectric film is directly contacted with the surface of the carbon nanotube, defects will be formed. In this case, it is desirable that the oxide ferroelectric film may be formed after a nitride film having a thickness of some several nm is deposited on the surface of the carbon nanotube.

The gate 400 is necessary to be used a higher conductivity material than that of the memory means 300. The gate 400 is constructed by a material, which has a smaller chemical reactivity and a superior adhesion property, with respect to the memory means 300. When this condition is not satisfied, a reaction barrier layer or an adhesion layer may be provided between the gate 400 and the memory means 300 to solve the problem.

A conventional silicon gate may be used as the gate 400. If impurities are doped into the first semiconductor region 100 having a fine cross section, variation in transistor characteristics increases. Therefore the first semiconductor region 100 having a fine cross section into which impurities are not doped is used. At this time, a material having a work function near to a mid gap of the first semiconductor region 100 may be used for the gate 400. For example, it is preferable that TaN or TiN is used as the material of the gate 400 for the first semiconductor region 100 made of silicon.

The first region 210 and the second region 220 of the memory device 1 is provided with a semiconductor having a desired conductivity type of a carrier which is extracted from the first semiconductor region 100, a metal, or a metal silicide. The first and second regions 210 and 220 can be formed by introducing impurities into a portion of the first semiconductor region 100 having a fine cross section which extends from a portion under the gate 400 to both sides of the gate 400. The first region 210 and the second region 220 can be formed by contacting or deposition of impurities doped semiconductor regions on the both edge portions of the first semiconductor region 100. As an another method, the first region 210 and the second region 220 can be formed by a deposition of a metal on both edge portions of the first semiconductor region 100. The formed metal layer may be annealed after the deposition of the metal layer. Moreover, the first and second regions 210 and 220 may be formed by combination of the above-mentioned methods.

The first region 210 and second region 220 may be formed to have a larger cross section or a larger plain surface dimension than the first semiconductor region 100 having the fine cross section for the purpose of providing an electrode. In this case, regions in which a carrier is induced by an external field are provided in a portion of the first semiconductor region 100 having the fine cross section extending from a portion under the gate 400 between the gate 400 and the first region 210 and the second region 220. The regions may be used as an induced first region and an induced second region.

When a plurality of pairs of the memory means 300 and the gate 400 are provided to the first semiconductor region 100 having the fine cross section, the induced first region and the induced second region in which carriers are induced by the external field in the first semiconductor region 100 having the fine cross section between the gates 400 may be used.

When regions in which carriers are induced by an external field may be provided in a portion of the first semiconductor region 100 having the fine cross section extending from a portion under the gate 400 between the gate 400 and the first region 210 and the second region 220 including a metal, these regions may be used as the induced first region and the induced second region.

The first region 210 and second region 220 having any of the above-mentioned configurations have sufficient conductivity to extract electric current from the first semiconductor region 100 having the fine cross section provided under the memory means 300.

Next, a second embodiment of a memory device of the present invention will be explained.

FIG. 3 is a schematic cross-sectional view showing a structure of a memory device 2 which is the second embodiment of the present invention. As shown in FIG. 3, a memory device 2 of the present invention includes the first and second regions 210 and 220 provided on a substrate 10, the first semiconductor region 100 having a fine cross section, the memory means 300 formed on the first semiconductor region 100, and the gate 400 formed on the memory means 300. On the left side of the first region 210 and right side of the second region 220, there are insulation films 20 provided on the substrate as isolation layers. Both edges of the first semiconductor region 100 are respectively connected to a portion 212 having a relatively larger cross section of the first region and a portion 222 having a relatively larger cross section of the second region by a part 211 of the first region and a part 221 of the second region.

The memory means 300 is provided on the first surface 100A including both upper and lower side surfaces of the first semiconductor region 100 having the fine cross section. A region 30 surrounded by the lower part of the memory means 300 and the first and second regions 210 and 220 is a gap. That is, the first semiconductor region 100 having the fine cross section is separated from the substrate 10 by the gap 30. Depending on the manufacturing method, the gate 400 is not formed under the memory means 300 in a part of the gap 30. Here, the gap 30 may be filled with an insulating material.

The first and second regions 210 and 220 comprise: the regions 211 and 221 extended portions from the first semiconductor region 100 at both sides of the gate 400 and having approximately same cross-sectional areas as the first semiconductor region 100 having the fine cross section; and the regions 212 and 222 having relatively larger areas. The regions 212 and 222 having relatively larger areas are used as connection portions for connection with inter-connections or other elements or support members.

The memory means 300 is comprising: the lower insulation film 310; the carrier trapping insulation film 320; and the upper insulation film 330 sequentially is stacked in this order on the surface of the first semiconductor region 100.

Materials of the memory means 300 and the like where the first semiconductor region 100 includes silicon will be explained. The lower and upper insulation films 310 and 330 of the memory means 300 may be silicon oxide films and the carrier trapping insulation film 320 may be a silicon nitride film.

The silicon oxide film to be the lower insulation film can be formed by an oxidization method in which surface index dependence of oxidization rate is relaxed. An oxidization method of combusting hydrogen and oxygen in the vicinity of a wafer under reduced pressure (hereinafter referred to as reduced pressure pyrogenic) (e.g., 10 torr, 700 degrees centigrade (° C.)) may be used.

It is preferable that an atomic layer deposition method (hereinafter also referred to as ALD method) will be used for the silicon nitride film 320 formation. According to deposition of silicon nitride films by a conventional CVD method, it is difficult to uniformly form a film having thickness of approximately 4 nm because the layer is deposited in the shape of islands. However, if the surface of the silicon oxide film 310 which is the lower insulation film is nitrogenized by plasma nitridation or the like, it is possible to form a film having a surface in which islands are continuously formed resulting in a film with continued island surface even by thermal CVD using di-chloro-silane and ammonium.

The silicon oxide film 330 to be the upper insulation film can be deposited by a high temperature CVD method using silane and nitrogen monoxide as raw materials, which does not generate a large difference in film thickness between top, back, and side surfaces of the deposited structure and can grow isotropically. Otherwise, silicon nitride film may be deposited on the silicon oxide film 310 and then the silicon nitride film is oxidized by a predetermined thickness by reduced pressure pyrogenic oxidization (e.g., 10 torr, 850° C.) to obtain the silicon oxide film to be the upper insulation film 330.

The carrier trapping level which contributes to long term retention is formed not only inside the silicon nitride film 320 but in an interface between the silicon nitride film 320 and the silicon oxide film 330 which is the upper insulation film.

The gate 400 may be made of TiN, TaN, or the like.

Valence control impurities such as a donor or an acceptor are not necessarily introduced to the silicon 100 having the fine cross section.

In a case where the memory device is a p channel, boron is introduced and in a case where the memory device is an n channel, arsenic is introduced to the first and second regions 210 and 220 by a conventionally known technique such as ion implantation. The impurity concentration in the regions 211 and 221, which is the portion of the first and second regions 210 and 220 in contact with the silicon 100 having the fine cross section, is approximately $1\times10^{19}$ atoms/cm$^3$. The regions 212 and 222 having relatively larger cross-sections of the first and second regions 210 and 220 may have one order higher impurity concentration to reduce series resistance or contact resistance.

It is preferable that the thermal annealing after ion implantation is carried out in a low temperature and short period of time within the ranges which enable recovery from defects caused by the ion implantation. Diffusion of impurities in the first semiconductor region (silicon) 100 having the fine cross section, under the gate 400 during the thermal annealing is achieved with shallower diffusion depth than that of the conventionally known diffusion depth because the equivalent sectional radius of the fine cross section is small. The portion of the first semiconductor region where the impurities are introduced at outside of the gate 400 become the region 211 and 221.

Figure 4:
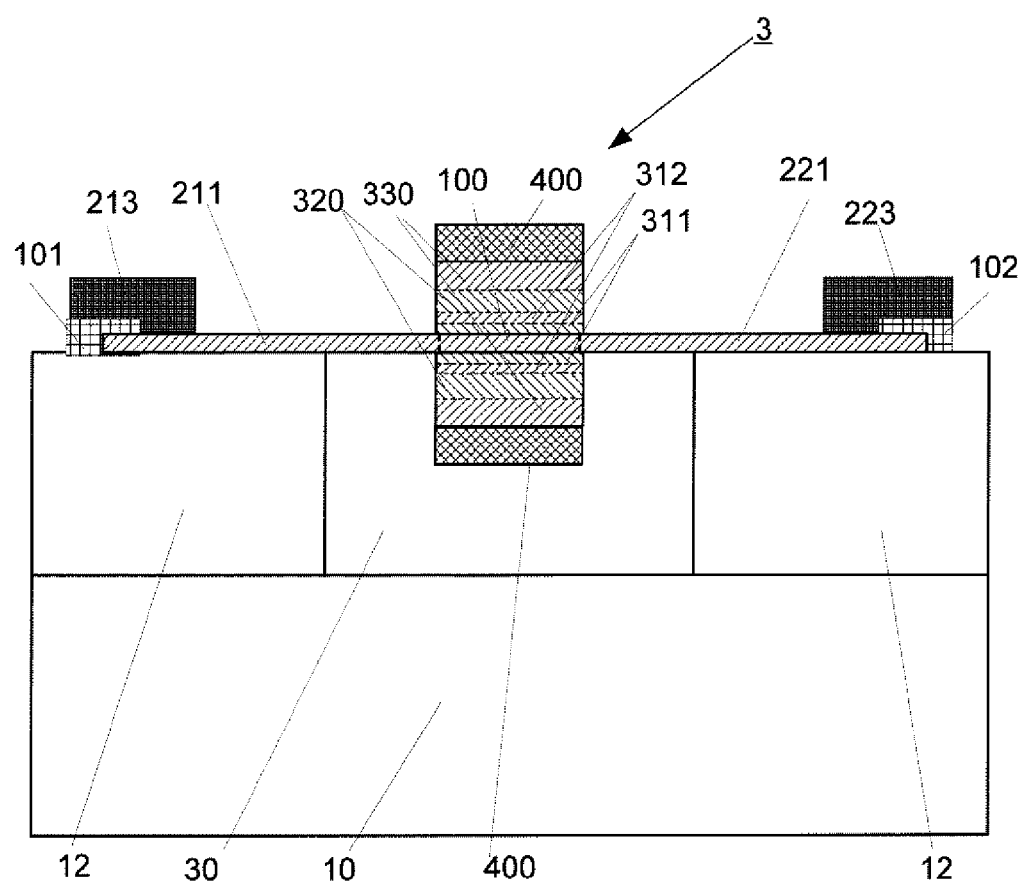
FIG. 4 is a cross-sectional view schematically showing a configuration of a third embodiment of a memory device of the present invention.

FIG. 4 is a schematic cross-sectional view showing a structure of a third embodiment of the present invention. As shown in FIG. 4, the first semiconductor region 100 having the fine cross section, of a memory device 3 of the present invention includes a carbon nanotube (CNT). In the figure, the substrate 10 is a silicon substrate. An insulation film 12 including an oxide silicon film is provided on the silicon substrate 10 and the gap 30 is further provided in the silicon oxide film 12. The gap 30 is formed by selective etching or the like after a later-described carbon nanotube growth onto the insulation film 12 and can be buried by an insulating material after the later-described gate 400 is formed.

The carbon nanotube 100 may be formed with catalyst layers 101 and 102 as growth points formed on the insulation film 12. Iron, nickel, cobalt, or a compound thereof may be used as the catalyst layer 101 and 102. A single wall carbon nanotube can be used as the carbon nanotube 100.

The catalyst layer 101 and 102 respectively becomes the first and second region. Further, electrode layers 213 and 223 may be provided to the catalyst layers 101 and 102 to be the first and second regions and to the carbon nanotube. The electrode layers 213 and 223 include a metallic material such as gold and respectively will be a part of the first and second regions.

The memory means 300 includes the lower insulation film 310 having a first lower insulation film 311 which is in contact with the semiconductor region 100 and a second lower insulation film 312, the carrier trapping insulation film 320, and the upper insulation film 330 sequentially by the order from the first semiconductor region 100 having the fine cross section side.

Since the semiconductor region 100 is a carbon nanotube, it is preferable that the first lower insulation film 311 is a silicon nitride film which is formed by a low temperature thin film isotropic growth technique such as CVD using ammonia radical (ammonia gas activated by light, hot filament, or the like) or remote plasma of ammonium and silane as raw materials.

The second lower insulation film 312 may be a silicon oxide film. The silicon oxide film 312 can be formed by plasma oxidization using remote plasma of oxygen on a surface of a silicon nitride film grown as the first lower insulation film 311.

The carrier trapping insulation film 320 may be a silicon nitride film. The silicon nitride film 320 can be formed by the isotropic film-forming method explained for FIG. 3.

A silicon oxide film or an alumina film may be used as the upper insulation film 330. The silicon oxide film can be formed by the isotropic film-forming method explained for FIG. 3. The alumina film can be formed by use of an atomic layer deposition (ALD) method.

A TiN film, a TaN film, or the like may be used for the gate 400.

Figure 5:
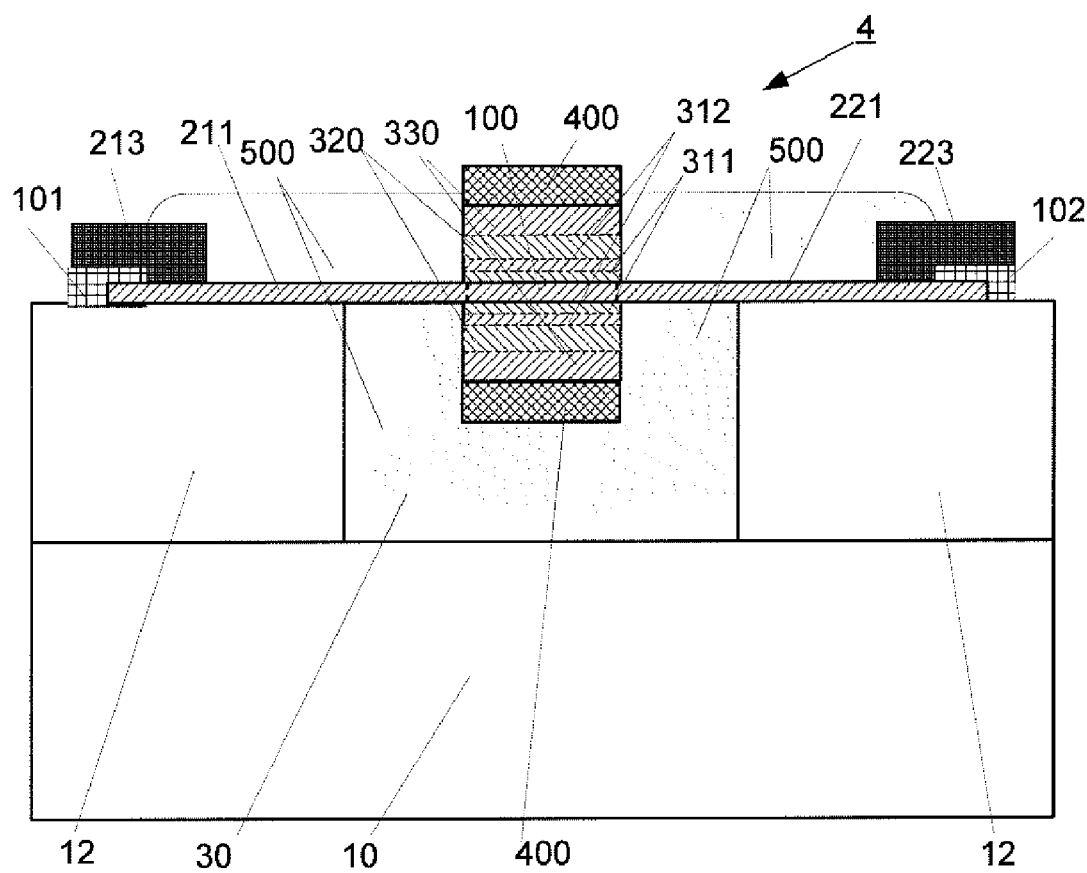
FIG. 5 is a cross-sectional view schematically showing a modified example of the third embodiment of a memory device of the present invention.

FIG. 5 is a schematic cross-sectional view showing a modification example of the third embodiment of the memory device of the present invention.

A difference between memory device 4 shown in FIG. 5 and the memory device 3 shown in FIG. 4 is that a surface protection film (i.e. a passivation film) 500 including a silicon nitride film or the like is further provided on the gap 30 of the memory device 3 and on the surface of the memory device 3 of FIG. 4. The surface passivation film 500 can be deposited by catalyst CVD or plasma CVD method. Other configuration of the memory device 4 is the same as that of the memory device 3 as shown in FIG. 4 and therefore explanation thereof is omitted.

Figure 6:
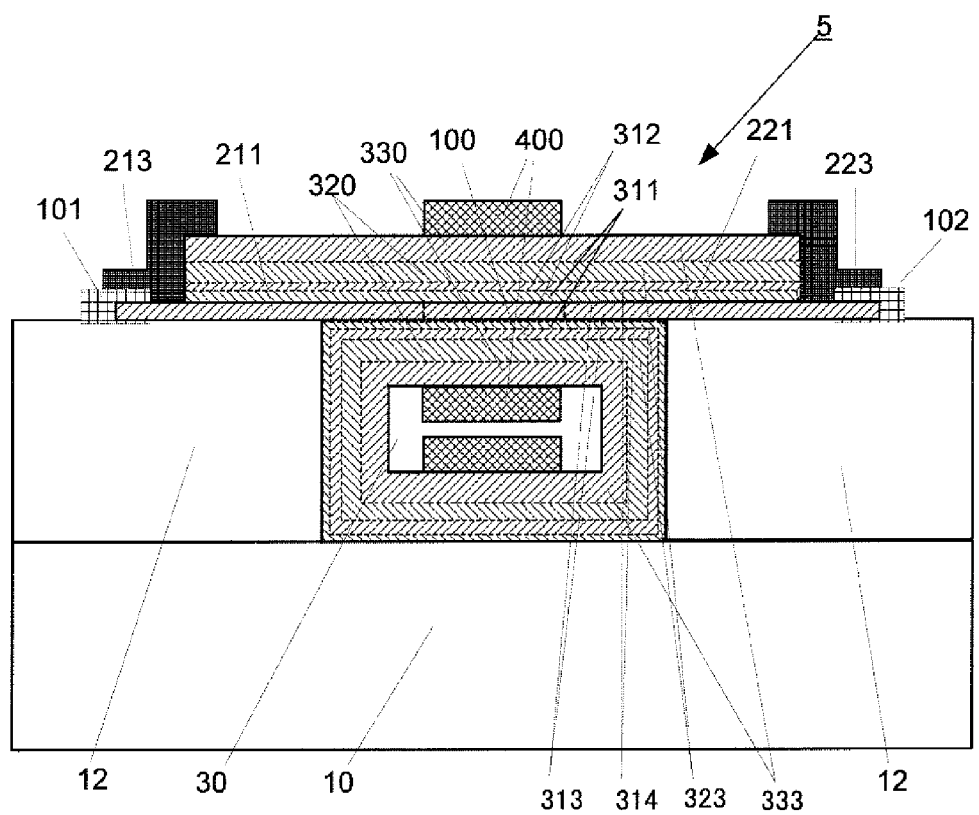
FIG. 6 is a cross-sectional view schematically showing another modified example of the third embodiment of a memory device of the present invention.

FIG. 6 is a schematic cross-sectional view showing another modification example of the third embodiment of the memory device of the present invention. As shown in FIG. 6, a film 313 (formed simultaneously with a layer 311 of the lower insulation film to be in contact with the first semiconductor region), a film 314 (formed simultaneously with the part 312 of the lower insulation film), a film 323 (formed simultaneously with the carrier trapping insulation film 320), and a film 333 (formed simultaneously with the upper insulation film 330) are grown onto the CNT as a 4-layered films which is a carrier storage means of a memory device 5. These 4 layers other than a portion under the gate 400 are left to be utilized as the surface passivation film 500.

In the case of the memory devices 3, 4, and 5, if the positive voltage of 3 to 5V is applied to the silicon substrate 10 with respect to the metallic layers 213 or 223, electrons are induced on a surface of the CNT (211 or 221) between the gate 400 and the metallic electrode. If the negative voltage is applied, a hole is induced. Therefore, these portions can be the induced first region and the induced second region where carriers are induced by an external field. Such devices can be used as an n-channel device or a p-channel device respectively.

Operation of the memory devices 1 to 5 of the present invention will be explained. Hereinafter, the operation with memory device 1 will be explained unless otherwise noted. However, the other memory devices 2 to 5 are operated in a similar manner.

Figure 7:
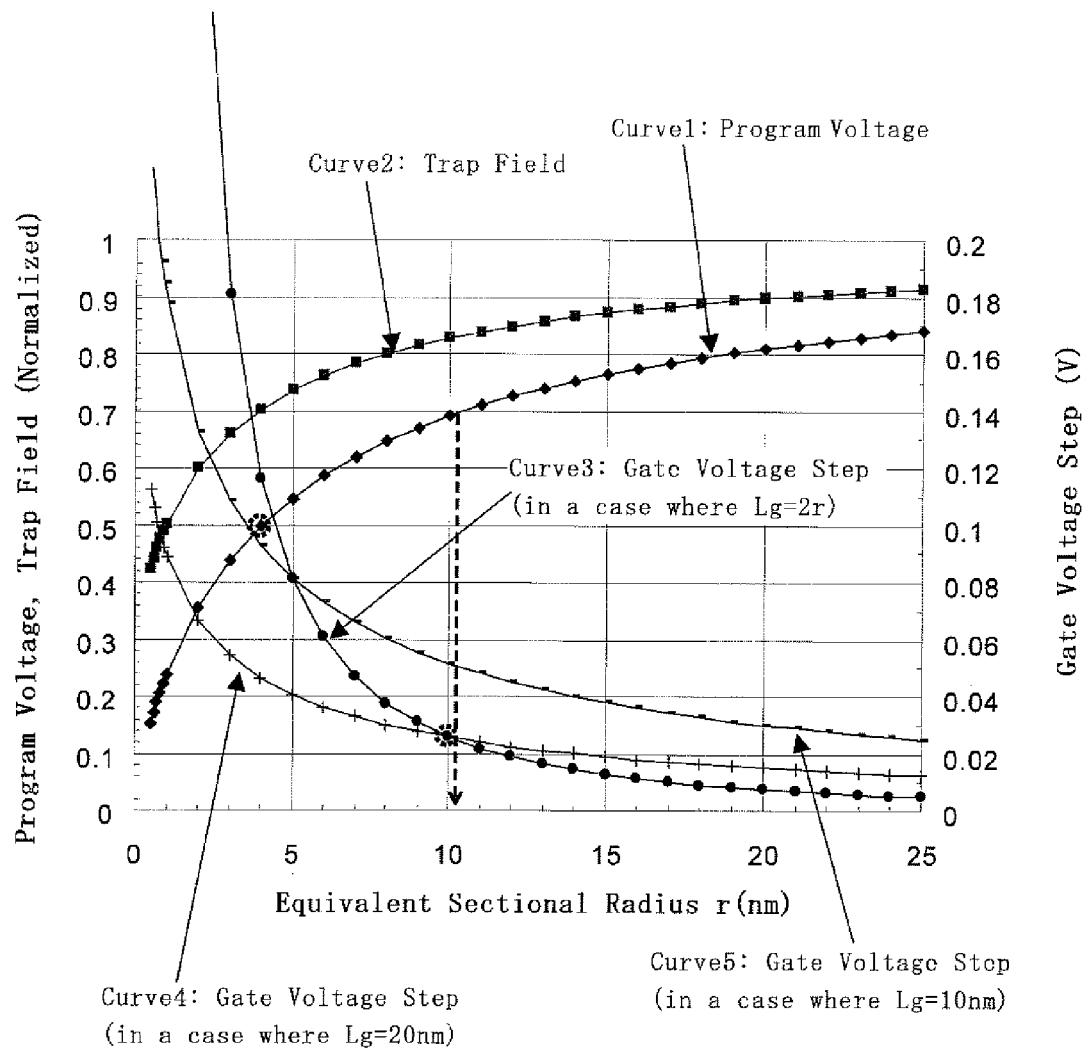
FIG. 7 is a graph showing a relation of program voltage to, trap field to, and gate voltage step to an equivalent sectional radius of a first semiconductor region of the memory device of the present invention.

FIG. 7 is a view showing relation between program voltage, trap field, and gate voltage step to an equivalent sectional radius of the first semiconductor region 100 of the memory device 1 of the present invention. In FIG. 7, a horizontal axis is an equivalent sectional radius (nm).

A curve 1 of FIG. 7 shows how the voltage (program voltage) for writing or erasing is reduced by the memory device 1 of the present invention compared to a conventional planar type device. Left vertical axis in FIG. 7 is normalized by each corresponding value of the planar type device. It is understood from the figure that the equivalent sectional radius needs to be equal to or smaller than the equivalent oxide film thickness tm (10 nm in this case) of the memory means 300 to suppress the voltage for writing and erasing to be less than 70% of the conventional planar type device, as shown by a dotted line that is directed from the curve 1 to bottom side of the paper.

FIG. 7 shows a case where tm is 10 nm. However, in a case where the equivalent sectional radius r of the horizontal axis is normalized by the equivalent oxide film thickness tm used for a memory means, reduction ratio of the program voltage becomes an almost similar curve irrespective of the thickness of the memory means 300. Therefore, the equivalent sectional radius of the first semiconductor region 100 is set to be equal to or smaller than the equivalent oxide film thickness of the memory means 300 in the memory device 1 of the present invention.

Even if the equivalent oxide film thickness tm varies between 6 nm and 20 nm, the program voltage becomes 70% or less as long as r/tm is 1 or less. Further, in a case where the equivalent sectional radius is reduced to be 0.4 times as tm, the program voltage is 50% (indicated by a dotted circle on the curve 1) and if the equivalent sectional radius is reduced to 0.15 times as tm, the voltage for writing or erasing becomes 30% of that of a planar device.

This effect of the program voltage is common to memory devices which use a principle that writing and erasing are carried out by applying a high field to the memory means 300. Examples thereof include a carrier tunneling which passes an insulation film, a Fowler Nordheim tunneling, hot carrier injection, polarization change of a ferroelectric material, and the like.

When the memory device 1 of the present invention is operated as an insulated gate transistor, the effective gate insulation film thickness thereof is also reduced if the equivalent sectional radius r is reduced, similarly to the case of the program voltage shown in FIG. 7.

Moreover, a curve 2 in FIG. 7 indicates a reduction ratio of a field in a position where a charge is trapped in the memory means 300 (hereinafter referred to as a trap field). This is a case where a position where a charge is trapped is in approximately half the thickness of the equivalent oxide film of the memory means 300 from the surface of the first semiconductor region 100 having the fine cross section in the memory means 300. Ratio of the trapped charge loss has an exponential function dependence on this field. Therefore, even if the tens of percent of the field are reduced, the retention characteristics of memory are improved significantly.

A case where multi-level memorization can be meaningfully achieved by regulating the equivalent sectional radius r or the gate length Lg in the memory device 1 of the present invention will be explained.

If one electron or one hole is trapped, or if a dipole in the case of the ferroelectric material is inverted, the current characteristics between the first and second regions with reference to the gate voltage (hereinafter referred to as gate voltage-current between first and second regions characteristics) in the memory device 1 of the present invention change step by step.

A right vertical axis in FIG. 7 indicates a gate voltage step ($\Delta V$) observed in the above occurrence in the gate voltage axis in the gate voltage-current between first and second regions characteristics. Curves 3, 4, and 5 in FIG. 7 indicate gate voltage steps observed in the above occurrence in the gate voltage axis with reference to the equivalent sectional radius of the first semiconductor region 100 (hereinafter referred to as gate voltage step).

The gate voltage step can be utilized for multi-level memory not as a conventional analog multi-level interval depending on a writing condition but as a multi-level interval converted to a gate voltage which is unique to an device structure, a material, or the like.

To use the gate voltage step for the multi-level memory under an operation temperature T, a voltage step equal to or more than kT/q is required. If the operation temperature is set to room temperature, a gate voltage step of 0.026V or more is required.

In the memory device of the present invention, the equivalent sectional radius r of the first semiconductor region 100 having the fine cross section and the gate length Lg (refer to Lg in FIG. 1) can be regulated to achieve multi-level converted to a gate voltage step which is unique to a memory device and can be identified in an operation temperature. The curve 3 in FIG. 7 indicates the gate voltage step versus the equivalent sectional radius in a case where the gate length Lg is 2r (equivalent diameter) and it is understood from the figure that setting the equivalent sectional radius to 10 nm or less is sufficient to obtain the gate voltage step of 0.026V or more. Similarly, as indicated by a dotted circle in the curve 4, it is understood that when the gate length Lg is fixed to be 20 nm, it is required to set the equivalent sectional radius r to be 10 nm or less. It is understood that when the equivalent sectional radius r is set to be 10 nm, the gate length Lg may be 20 nm or less.

The gate voltage step does not largely depend on tm if tm is within a range of between 6 and 20 nm. Since the gate voltage step has a component which is inversely proportional to the gate length Lg, the voltage step can have a margin to the variation in tm by reducing the gate length more.

In the memory device 1 of the present invention, the equivalent sectional radius r is set to be 10 nm or less for multi-level memory using the gate voltage step. Here, the gate voltage step when the gate length Lg is 10 nm is indicated by the curve 5 in FIG. 7 just for reference.

Next, current-voltage characteristics, multi-level memorization, and a reading method of the memory device of the present invention will be explained.

Figure 8:
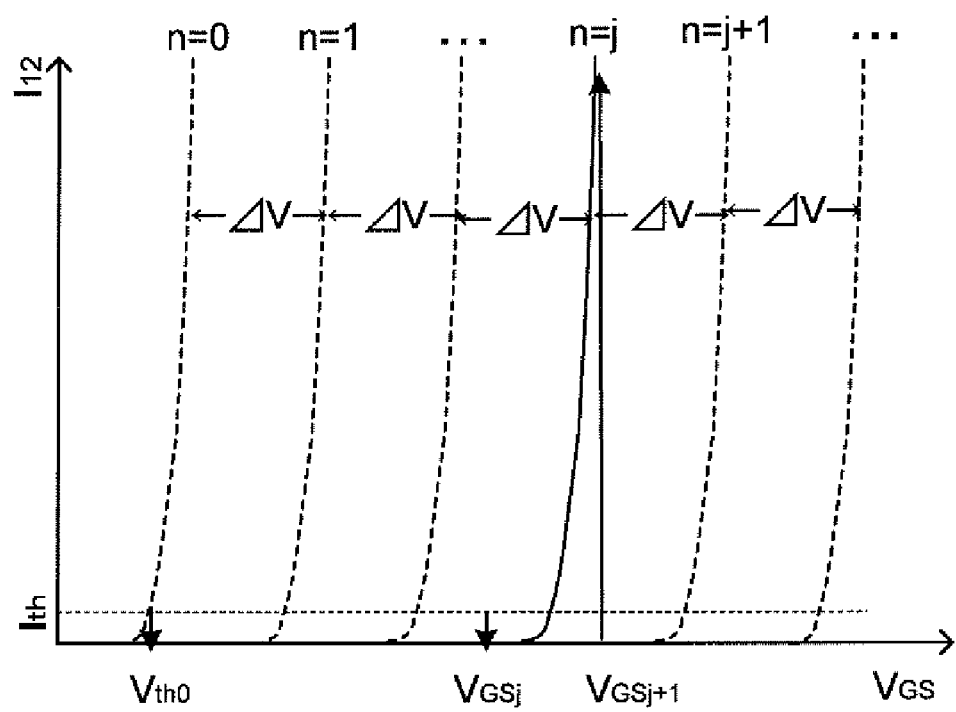
FIG. 8 is a graph showing current-voltage characteristics in a case where voltage between the first and second regions of the memory device of the present invention is large.

FIG. 8 is a graph showing current-voltage characteristics in a case where a voltage between the first and second regions of the memory device of the present invention is large. FIG. 8 is so-called gate voltage-current between first and second region characteristics (hereinafter also simply referred to as IV characteristics) and shows an example where the IV characteristics change in a voltage axis direction according to the number of trapped carriers. FIG. 8 shows a current $I_{12}$ between the first and second regions—gate voltage $V_{GS}$ characteristics in a case where the voltage between the first and second regions is larger than the gate (threshold) voltage step, for example, is 0.5V.

Every time a carrier is trapped by the memory means 300, the IV characteristics are shifted by one unit of a unique value $\Delta V$ (in the case of the example 2, approximately 0.1V) along the gate voltage axis. Therefore, in case the gate threshold voltage when the memory means 300 does not trap a carrier is $V_{th0}$, it is possible to recognize whether the number of trapped carriers n is equal to or larger or smaller than j, by observing whether current $I_{12}$ flowing between the first and second regions when the gate voltage for reading $V_{GSj}$ is set within a range of between $V_{th0}+j\Delta V$ and $V_{th0}+(j+1)\Delta V$ is equal to or larger or smaller than $I_{th}$.

Here, $I_{th}$ is current flowing between the first and second regions when $V_{GS}=V_{th0}$ (with zero carrier in the memory means). It is possible to recognize the number of trapped carriers n by a value of j which gives the gate voltage for the following change in $I_{12}$ when the reading gate voltage is varied from n=0 to necessary number j+1 and the current $I_{12}$ flowing between the first and second regions is varied from less than $I_{th}$ to more than $I_{th}$.

Figure 9:
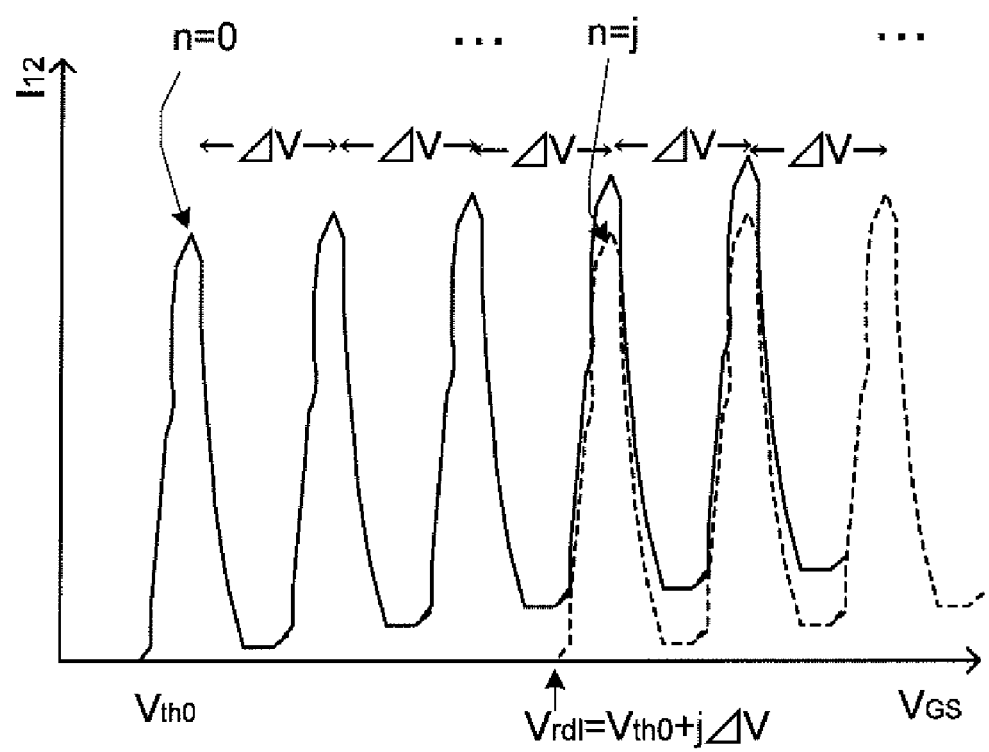
FIG. 9 is a graph showing current-voltage characteristics in a case where voltage between the first and second regions of the memory device of the present invention is small.

FIG. 9 is a graph showing current-voltage characteristics of the memory means of the present invention in a case where the voltage between the first and second regions is small. FIG. 9 shows a gate voltage-current characteristics between first and second regions and shows a variation example of the IV characteristics in cases where the number of trapped carriers is 0 and j (dotted line). In a case where the voltage between the first and second regions is smaller than the gate (threshold) voltage step, for example, is 0.05V, the current $I_{12}$ flowing between the first and second regions periodically increases or decreases with a voltage interval close to the gate voltage step as the gate voltage increases as shown in FIG. 9.

However, in a case where capacitance between the first semiconductor region surface 100A under the gate 400 and the first or the second region cannot be ignored compared to the capacitance between the gate 400 and the first semiconductor region surface 100A, the temperature under which the increase and decrease in current is developed is lower than the temperature under which the characteristics in FIG. 9 are expected neglecting the above capacitance and $\Delta V$ value is also small.

The IV characteristics are shifted along the gate voltage axis by the gate threshold voltage step every time a carrier is trapped by the memory means 300. Therefore, current pulse number obtained by sweeping the gate voltage $V_{GS}$ from less than $V_{th0}$ to a predetermined voltage $V_{rd1}$ changes according to number of carriers trapped. The amount of current flowing between the first and the second regions increases or decreases in time axis by sweeping the gate voltage to generate the current pulse.

When $V_{rd1}=V_{th0}+j\Delta V$, and the number of trapped carriers is zero (strictly speaking, no increase from an initial value where nothing is written in), the current pulse number is j, if the number of trapped carriers is 1, the current pulse number is j−1, and if the number of trapped carriers is j, the current pulse number is 0.

Therefore, when the multi-level memory can be significantly realized by the memory device 1 of the present invention by regulating the equivalent sectional radius r or the gate length Lg, that is, when the equivalent sectional radius is set to be 10 nm or less and the gate length is set to be 20 nm or less, a ramp voltage pulse which varies from less than $V_{th0}$ to $V_{rd1}$ is applied to the gate and the number of current pulse is obtained between the first and second regions. It will be understood that the number of carriers trapped by the memory means 300 by counting this current pulse. Thus, it becomes possible to read multi-level information stored in the memory means 300.

In the memory device 1 of the present invention, if the lower insulation film 310 is set to be a silicon oxide film having thickness of 2 nm or less, a memory retention period is shortened but the program voltage becomes smaller and the program time becomes shorter than 100 ns. The memory device 1 having such electric characteristics can be used as a kind of a DRAM having long refresh time, although application area thereof is limited.

EXAMPLE 1

Hereinafter, the present invention will be explained more in detail.

As an example 1, a memory device 2 as shown in FIG. 3 was manufactured as follows:

A $Si_{1-x}Ge_X$ layer was heteroepitaxially grown onto a silicon substrate 10 and a extremely thin layer of silicon to be the first semiconductor region 100 having a fine cross section was heteroepitaxially grown onto the $Si_{1-x}Ge_X$ layer.

By use of a side wall forming technique, an etching mask having a fine line width was formed and using it as a mask, etching of the silicon extremely thin layer was carried out to leave a silicon extremely thin layer having a fine width in a direction perpendicular to the paper of FIG. 3.

Next, the gap 30 was formed by using a selective etching agent (selective etchant) for the $Si_{1-x}Ge_X$ layer.

The silicon 100 having a fine cross section was separated from the substrate 10 by the gap 30. The cross-section thereof was approximately rectangular. However, due to thermal annealing in hydrogen, a surface defect was annealed and each of the tops was rounded as shown in the cross section in FIG. 2. A length of a portion which was not a curved surface of a surface line of the cross section was 10 nm or less and the equivalent sectional radius of the cross-section was 8 nm.

As the memory means 300, the silicon oxide film 310, the silicon nitride film 320 to be the carrier trapping insulation film, and the silicon oxide film 330 were sequentially grown or deposited on the surface of the silicon 100 respectively by 3 nm, 4 nm, and 5 nm. The equivalent oxide film thickness of the memory means 300 was 10.8 nm.

A reduced pressure pyrogenic oxidization method was used to grow the silicon oxide film 310. Pressure was 10 torr, and oxidization temperature was 700° C. The silicon nitride film 320 was deposited by an atomic layer deposition method by approximately 7 nm. Then, the silicon nitride film was oxidized only by approximately 3 nm by way of reduced pressure pyrogenic oxidization (10 torr, 850° C.) to form a silicon oxide film to be the upper insulation film 330 having the thickness of 5 nm.

A carrier trapping level which contributes to a long-term memory was formed inside the silicon nitride film 320 and in an interface of the silicon oxide film 330 being the upper insulation film on the silicon nitride film 320.

The gate 400 was made of TiN. The gate length thereof was 40 nm and length between the first region 212 and the second region 222 was 120 nm. Thus, the memory device 2 of the example 1 was manufactured.

The voltage for writing for the memory device 2 of the example 1 was 9V and is lower than 14V for a conventional planar device. The voltage for erasing for the memory device 2 of the example 1 was −8V. This means that compared to −12V required for a conventional planar device, the voltage was reduced. Further, since the carrier injection from the gate 400 was reduced, an absolute value of voltage especially when erasing could be set large and erasing by millisecond was improved to sub millisecond.

EXAMPLE 2

As an embodiment 2, a memory device 4 as shown in FIG. 5 was manufactured. A single-wall carbon nanotube having a length of 100 nm and radius r of approximately 0.6 nm was used as the first semiconductor region 100 having a fine cross-section.

The memory means 300 included a silicon nitride film having thickness of 3 nm to be the first lower insulation film 311, a silicon oxide film having thickness of 2 nm to be the second lower insulation film 312, a silicon nitride film having thickness of 6 nm to be the carrier trapping insulation film 320, and a silicon oxide film having thickness of 5 nm or an alumina film having thickness of 12 nm to be the upper insulation film 330. The gate 400 was formed by a TiN film having thickness of 50 nm. A silicon nitride film was used as the surface passivation film 500.

The first lower insulation film 311 was deposited by an isotropic low-temperature thin film growth technique such as CVD using ammonia radical or remote plasma of ammonium and silane as raw materials. The second lower insulation film 312 was formed by plasma oxidization of silicon nitride grown for the first lower insulation film by remote plasma of oxygen. The silicon nitride film as the carrier trapping insulation film 320 was deposited by the isotropic deposition technique. When alumina is used as the upper insulation film 330, the ALD method may be used.

The passivation film 500 can be deposited by general plasma CVD technique. However, as shown in FIG. 6, the film 313 (deposited simultaneously with the layer 311 of the lower insulation film in contact with the first semiconductor region), the film 314 (deposited simultaneously with 312 which is part of the lower insulation film), the film 323 (deposited simultaneously with the carrier trapping insulation layer 320), and the film 333 (deposited simultaneously with the upper insulation film 330) were grown onto the CNT at a portion other than a gate portion simultaneously with the growth of the 4-layered films for the memory means and were left to be utilized as the surface passivation film 500.

In case of the memory device 4 of the example 2, the program voltage was approximately 3V. Meanwhile, a planar device equivalent to a case where the carbon nanotube 100 of the memory device 4 was used does not exist. Therefore, if it is assumed that graphen or other planar material is used as the planar device, it is estimated that the program voltage thereof is approximately 16V. Therefore, it is understood that the program voltage of the example 2 is very small.

In the example 2, if the gate length of the memory device 4 is 20 nm, the gate threshold voltage step which changes according to one trapped carrier is approximately 0.1V. This is a value which can be sufficiently used for multi-level memory under the room temperature.

The present invention is not limited to the above-mentioned embodiments and examples and various modifications can be made within the scope of the invention described in the claim. For example, it is needless to say that structure, dimension, or the like of the first semiconductor region 100, the memory means 300, and the gate 400 may be set depending on the purpose of usage of the memory device 1 and the scope of the present invention also includes them.

INDUSTRIAL APPLICABILITY

The memory device 1 of the present invention is a technique to overcome the limitation of a flash memory which blocks development of nano CMOS and can be used as an advanced nano CMOS memory for a terra-bit flash memory and as an advanced nano CMOS embedded memory. Further, adding a function of memory to the field of CNT electric devices as well as transistor such as FET, it is expected that the application of the CNT devices is further enhanced.

What is claimed is:
1. A memory device, comprising:
a first semiconductor member having a generally columnar shape having an operative length and a first surface along the operative length, said generally columnar shape defining a cross section that would appear when cut in a direction perpendicular to the operative length;
a memory means provided on the first surface of the first semiconductor member, the memory means at least partially surrounding the first semiconductor member at a location at which said cross section is defined; and
a gate provided on the memory means, and
wherein:
said first semiconductor member includes one of silicon, germanium, and compound semiconductor,
said memory means includes one of an insulation film including a layer of charge trapping atoms, a multilayered insulation films, and a ferroelectric material,
an equivalent sectional radius of the cross section of the first semiconductor member is set to be equal to or smaller than an equivalent silicon oxide film thickness of the memory means,
said equivalent sectional radius is defined as a radius of curvature of a circle having the same cross-sectional area as the area of the cross section of said first semiconductor member, and
said equivalent silicon oxide film thickness of the memory means is defined as a thickness of the memory means in a direction normal to the first surface of the first semiconductor member on which the memory means is provided, multiplied by the dielectric constant of silicon oxide and divided by the dielectric constant of the memory means, and when the memory means essentially consists of a plurality of layers, said equivalent oxide film thickness of the memory means is a sum of all of the equivalent silicon oxide film thicknesses of the respective layers constituting the memory means.

2. The memory device, as set forth in claim 1,
said first semiconductor member comprises a compound semiconductor, and a layer in said memory means that is in contact with the first surface of the first semiconductor member is made of silicon nitride.

3. The memory device, as set forth in claim 1,
wherein:
said first semiconductor member includes a carbon nanotube, and
a layer in said memory means that is in contact with the first surface of the first semiconductor member is made of silicon nitride.

4. The memory device as set forth in any one of claims 1 to 3, wherein a first region and a second region are provided in contact with the first semiconductor member on both sides of the gate and spaced apart across the gate.

5. The memory device as set forth in claim 1, wherein the first semiconductor member comprises silicon, and a layer of the memory means which is in contact with the first surface of the first semiconductor member is a thermally oxidized film having film thickness with small surface indices dependence.

6. The memory device as set forth in claim 1, wherein the multilayered insulation films includes an upper insulation film, a carrier trapping insulation film, and a lower insulation film as viewed in the direction normal to the first surface of the first semiconductor member from the gate side.

7. The memory device as set forth in claim 6, wherein the upper insulation film is a silicon oxide film.

8. The memory device as set forth in claim 6, wherein the upper insulation film is an aluminum oxide film.

9. The memory device as set forth in claim 6, wherein the carrier trapping insulation film is a silicon nitride film.

10. The memory device as set forth in claim 6, wherein the lower insulation film is a silicon oxide film.

11. The memory device as set forth in claim 6, wherein the lower insulation film is a multilayer film of a silicon oxide film on a silicon nitride film on the first surface of the first semiconductor member.

12. The memory device as set forth in any one of claims 1 to 3, wherein titanium atoms, which are aggregates of 1 or 10 or less atoms separated from each other, are buried in the insulation film as the layer of charge trapping atoms.

13. The memory device as set forth in any one of claims 1 to 3, wherein silicon atoms, which are aggregates of 1 or 10 or less atoms separated from each other, are buried in the insulation film as the layer of charge trapping atoms.

14. The memory device as set forth in any one of claims 1 to 3, wherein a layer in the memory means in contact with the first semiconductor member on the first surface includes a silicon oxide layer or an aluminum oxide layer provided on a silicon nitride layer.

15. The memory device as set forth in claim 2 or 3, wherein the multilayered insulation films includes an upper insulation film, a carrier trapping insulation film, and a lower insulation film as viewed in the direction normal to the first surface of the semiconductor member from the gate side.

16. The memory device as set forth in claim 15, wherein the upper insulation film is a silicon oxide film.

17. The memory device as set forth in claim 15, wherein the upper insulation film is an aluminum oxide film.

18. The memory device as set forth in claim 15, wherein the carrier trapping insulation film is a silicon nitride film.

19. The memory device as set forth in claim 15, wherein the lower insulation film is a multilayer film of a silicon oxide film on a silicon nitride film on the first surface of the first semiconductor member.

20. A memory device, comprising:
a first semiconductor member having a generally columnar shape having an operative length and a first surface along the operative length, said generally columnar shape defining a cross section that would appear when cut in a direction perpendicular to the operative length;
a memory means provided on the first surface of the first semiconductor member, the memory means at least partially surrounding the first semiconductor member at a location at which said cross section is defined; and
a gate provided on the memory means,
wherein:
said memory means includes one of an insulation film including a layer of charge trapping atoms, a multilayered insulation films, and a ferroelectric material,
an equivalent sectional radius of the cross section of the first semiconductor member is set to be equal to or smaller than an equivalent silicon oxide film thickness of the memory means,
said equivalent sectional radius is defined as a radius of curvature of a circle having the same cross-sectional area as the area of the cross section of said first semiconductor member, and
said equivalent silicon oxide film thickness of the memory means is defined as a thickness of the memory means in a direction normal to the first surface of the first semiconductor member on which the memory means is provided, multiplied by the dielectric constant of silicon oxide and divided by the dielectric constant of the memory means, and when the memory means essentially consists of a plurality of layers, said equivalent oxide film thickness of the memory means is a sum of all of the equivalent silicon oxide film thicknesses of the respective layers constituting the memory means, and
wherein length of a part of a line of intersection between the cross section of the first semiconductor member and the first surface has a part, which is not covered by the gate, and the length of the part is equal to or less than the thickness of the memory means.

21. A memory device, comprising:
a first semiconductor member having a generally columnar shape having an operative length and a first surface along the operative length, said generally columnar shape defining a cross section that would appear when cut in a direction perpendicular to the operative length;
a memory means provided on the first surface of the first semiconductor member, the memory means at least partially surrounding the first semiconductor member at a location at which said cross section is defined; and
a gate provided on the memory means,
wherein:
said memory means includes one of an insulation film including a layer of charge trapping atoms, a multilayered insulation films, and a ferroelectric material,
an equivalent sectional radius of the cross section of the first semiconductor member is set to be equal to or smaller than an equivalent silicon oxide film thickness of the memory means,
said equivalent sectional radius is defined as a radius of curvature of a circle having the same cross-sectional area as the area of the cross section of said first semiconductor member, and
said equivalent silicon oxide film thickness of the memory means is defined as a thickness of the memory means in a direction normal to the first surface of the first semiconductor member on which the memory means is provided, multiplied by the dielectric constant of silicon oxide and divided by the dielectric constant of the memory means, and when the memory means essentially consists of a plurality of layers, said equivalent oxide film thickness of the memory means is a sum of all of the equivalent silicon oxide film thicknesses of the respective layers constituting the memory means, and
wherein the equivalent oxide film thickness of the memory means is 20 nm or less.

22. A method of reducing programming voltage in a memory device that comprises:
a first semiconductor member having a generally columnar shape having an operative length and a first surface along the operative length, said generally columnar shape defining a cross section that would appear when cut in a direction perpendicular to the operative length;
a memory means provided on the first surface of the first semiconductor member, the memory means at least partially surrounding the first semiconductor member at a location at which said cross section is defined; and
a gate provided on the memory means, wherein
said memory means includes one of an insulation film including a layer of charge trapping atoms, a multilayered insulation films, and a ferroelectric material,
the method comprising:
setting an equivalent sectional radius of the cross section of the first semiconductor member equal to or smaller than an equivalent silicon oxide film thickness of the memory means,
wherein:
said equivalent sectional radius is defined as a radius of curvature of a circle having the same cross-sectional area as the area of the cross section of said first semiconductor member, and
said equivalent silicon oxide film thickness of the memory means is defined as a thickness of the memory means in a direction normal to the first surface of the first semiconductor member on which the memory means is provided, multiplied by the dielectric constant of silicon oxide and divided by the dielectric constant of the memory means, and when the memory means essentially consists of a plurality of layers, said equivalent oxide film thickness of the memory means is a sum of all of the equivalent silicon oxide film thicknesses of the respective layers constituting the memory means.

23. A memory device, comprising:
a first semiconductor member having a generally columnar shape having an operative length and a first surface along the operative length, said generally columnar shape defining a cross section that would appear when cut in a direction perpendicular to the operative length;

a memory means provided on the first surface of the first semiconductor member, the memory means at least partially surrounding the first semiconductor member at a location at which said cross section is defined; and a gate provided on the memory means, wherein:

said memory means includes one of an insulation film including a layer of charge trapping atoms, a multilayered insulation films, and a ferroelectric material, an equivalent sectional radius of the cross section of the first semiconductor member is set to be equal to or smaller than an equivalent silicon oxide film thickness of the memory means, said equivalent sectional radius is defined as a radius of curvature of a circle having the same cross-sectional area as the area of the cross section of said first semiconductor member, and said equivalent silicon oxide film thickness of the memory means is defined as a thickness of the memory means in a direction normal to the first surface of the first semiconductor member on which the memory means is provided, multiplied by the dielectric constant of silicon oxide and divided by the dielectric constant of the memory means, and when the memory means essentially consists of a plurality of layers, said equivalent oxide film thickness of the memory means is a sum of all of the equivalent silicon oxide film thicknesses of the respective layers constituting the memory means, and wherein multi-level charge storage is carried out, an interval between the multi-level is a discrete value depending on a structure or material and said interval converted to a gate voltage difference is equal to or more than kT/q (here, k is Boltzmann's constant, T is an absolute temperature of usage environment of the memory device, and q is an elementary charge of an electron).

24. The memory device as set forth in claim 23, wherein the equivalent sectional radius of the cross section is 10 nm or less, the gate length is 20 nm or less, and the value of the interval converted to a gate voltage difference is 0.026V or more.

25. The memory device as set forth in claim 23 or 24, wherein a first region and a second region are provided in contact with the first semiconductor member on both sides of the gate and spaced apart across the gate.

26. A method of reading the memory device of claim 25, the method comprising:

a step of detecting the number of carriers trapped at the memory means by counting the number of current pulse obtained between the first and second regions when a ramp voltage pulse is applied to the gate.

27. The memory device as set forth in any one of claims 23, 20, 21, wherein the first semiconductor member includes silicon, and a layer of the memory means in contact with the first surface of the first semiconductor member is a thermally oxidized film having film thickness with small surface indices dependence.

28. The memory device as set forth in any one of claims 23, 20, 21, wherein the multilayered insulation films includes an upper insulation film, a carrier trapping insulation film, and a lower insulation film as viewed in the direction normal to the first surface of the first semiconductor member from the gate side.

29. The memory device as set forth in any one of claims 23, 20, 21, wherein titanium atoms, which are aggregates of 1 or 10 or less atoms separated from each other, are buried in the insulation film as the layer of charge trapping atoms.

30. The memory device as set forth in any one of claims 23, 20, 21, wherein silicon atoms, which are aggregates of 1 or 10 or less atoms separated from each other, are buried in the insulation film as the layer of charge trapping atoms.

31. The memory device as set forth in any one of claims 23, 20, 21, wherein the upper insulation film is a silicon oxide film.

32. The memory device as set forth in any one of claims 23, 20, 21, wherein the upper insulation film is an aluminum oxide film.

33. The memory device as set forth in any one of claims 23, 20, 21, wherein the carrier trapping insulation film is a silicon nitride film.

34. The memory device as set forth in any one of claims 23, 20, 21, wherein the lower insulation film is a silicon oxide film.

35. The memory device as set forth in any one of claims 23, 20, 21, wherein the lower insulation film is a multilayer film of a silicon oxide film on a silicon nitride film on the first surface of the first semiconductor member.

* * * * *